US012707615B2

(12) United States Patent
Möller et al.

(10) Patent No.: US 12,707,615 B2
(45) Date of Patent: Aug. 11, 2026

(54) COMPOSITE MATERIAL AND SHIELDING AGAINST ELECTROMAGNETIC RADIATION

(71) Applicant: MAX-PLANCK-GESELLSCHAFT ZUR FÖRDERUNG DER WISSENSCHAFTEN E.V., Munich (DE)

(72) Inventors: Martin Möller, Aachen (DE); Khosrow Rahimi, Aachen (DE); Elizaveta Selezneva, Aachen (DE); Silke Rieder, Aachen (DE); Joachim Spatz, Stuttgart (DE)

(73) Assignee: Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 0 days.

(21) Appl. No.: 18/013,985

(22) PCT Filed: May 28, 2021

(86) PCT No.: PCT/EP2021/064328

§ 371 (c)(1),
(2) Date: Dec. 30, 2022

(87) PCT Pub. No.: WO2022/002500

PCT Pub. Date: Jan. 6, 2022

(65) Prior Publication Data

US 2023/0292480 A1 Sep. 14, 2023

(30) Foreign Application Priority Data

Jul. 2, 2020 (EP) .................................... 20183790

(51) Int. Cl.
*H05K 9/00* (2006.01)

(52) U.S. Cl.
CPC .................................... *H05K 9/009* (2013.01)

(58) Field of Classification Search
CPC ...................................................... H05K 9/009
See application file for complete search history.

(56) References Cited

U.S. PATENT DOCUMENTS 4,265,703 A * 5/1981 Terliska ................. D21H 21/40
162/146
4,378,322 A * 3/1983 Atterbury ............. B29C 70/882
264/105

(Continued)

FOREIGN PATENT DOCUMENTS

EP 0113785 A1 7/1984
EP 3141320 A1 3/2017

(Continued)

OTHER PUBLICATIONS

European Search Report mailed Dec. 11, 2020 corresponding to European Patent Application 20183790.3, 10 pages.

(Continued)

*Primary Examiner* — William D Young
(74) *Attorney, Agent, or Firm* — Dickinson Wright PLLC

(57) ABSTRACT

The present invention relates to a composite material for shielding electromagnetic radiation in the GHz range, comprising a matrix material and metal fibers, wherein the metal fibers contain at least one of the elements selected from the group consisting of copper, silver, gold, nickel, palladium, platinum, cobalt, iron, chromium, vanadium, titanium, aluminum, silicon, lithium, combinations of the foregoing and alloys containing one or more of the foregoing. Moreover, the present invention relates to a shielding against electromagnetic radiation comprising said composite material and (Continued)

Figure 1:
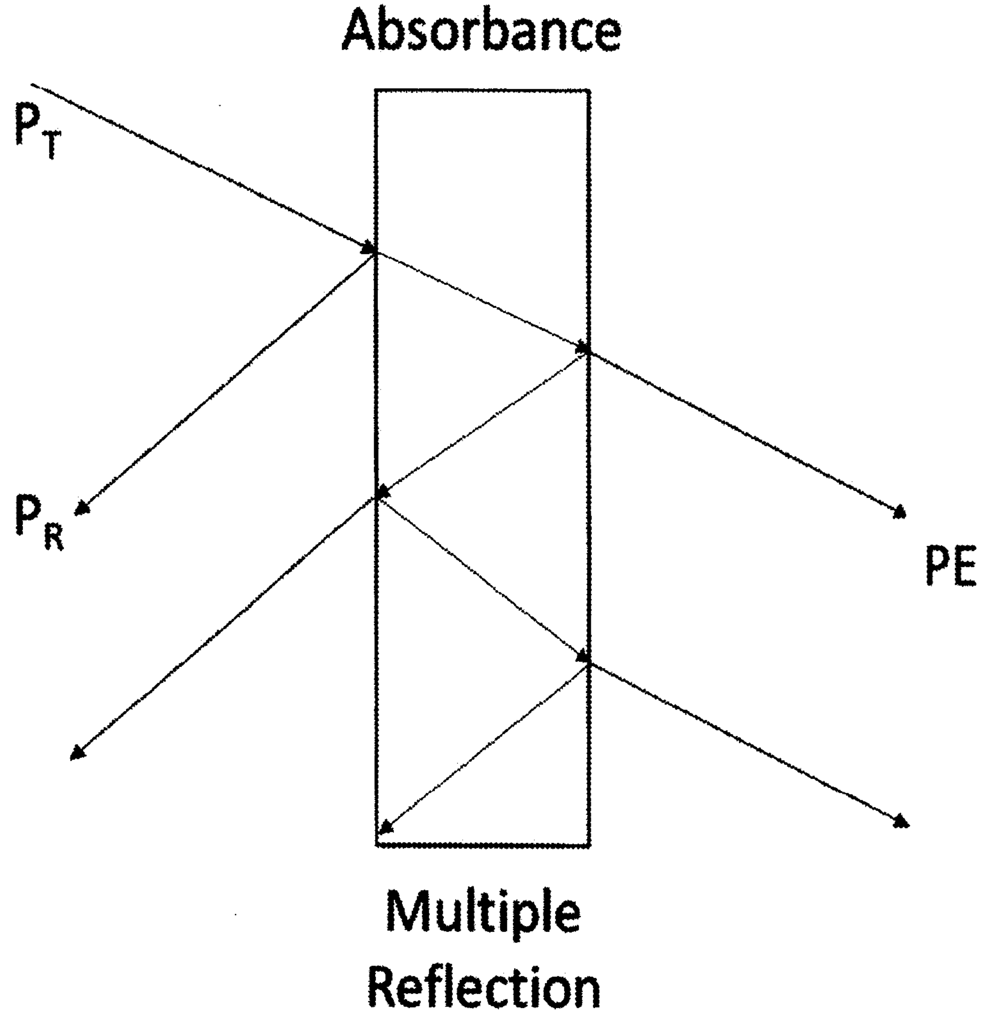

to an electronic device comprising at least one component which is shielded against electromagnetic radiation with said shielding.

16 Claims, 7 Drawing Sheets

(56) References Cited

U.S. PATENT DOCUMENTS

| | | | | |
|---|---|---|---|---|
| 4,500,595 | A | 2/1985 | Gerteisen et al. | |
| 4,538,151 | A | 8/1985 | Hatakeyama et al. | |
| 5,399,295 | A | 3/1995 | Gamble et al. | |
| 6,355,707 | B1 | 3/2002 | Jang et al. | |
| 7,022,265 | B2 | 4/2006 | Cheng et al. | |
| 7,030,172 | B2 | 4/2006 | Sakurai | |
| 8,520,406 | B2 | 8/2013 | Liang et al. | |
| 8,785,538 | B2 | 7/2014 | Kim et al. | |
| 10,583,691 | B2 | 3/2020 | Wu et al. | |
| 2004/0160377 | A1 | 8/2004 | Aisenbrey | |
| 2006/0128895 | A1 | 6/2006 | Aisenbrey | |
| 2018/0092258 | A1 | 3/2018 | Hoarfrost et al. | |
| 2021/0108047 | A1 * | 4/2021 | Matsumura | H05K 9/00 |

FOREIGN PATENT DOCUMENTS

| | | | |
|---|---|---|---|
| EP | 3617274 | A1 | 3/2020 |
| EP | 3741478 | A1 | 11/2020 |
| JP | S55-006577 | A | 1/1980 |
| JP | S62-238709 | A | 10/1987 |
| JP | 2004-224829 | A | 8/2004 |
| JP | 2005-510009 | A | 4/2005 |
| WO | 03/043028 | A2 | 5/2003 |
| WO | 2016020493 | A1 | 2/2016 |
| WO | 2017042155 | A1 | 3/2017 |
| WO | 2018/199008 | A1 | 11/2018 |

OTHER PUBLICATIONS

International Search Report mailed Aug. 5, 2021 corresponding to International Patent Application PCT/EP2021/064328, 16 pages.

Geetha, S., et al. "EMI Shielding: Methods and Materials-A Review." Journal of Applied Polymer Science, vol. 112, No. 4, Feb. 2009, pp. 2073-2086., https://doi.org/10.1002/app.29812.

Shukla, Vineeta. "Review of Electromagnetic Interference Shielding Materials Fabricated by Iron Ingredients." Nanoscale Advances, vol. 1, No. 5, Feb. 2019, pp. 1640-1671., https://doi.org/10.1039/c9na00108e.

A.H. Systems, Inc. "Shielding Effectiveness Test Guide," 5 pages.

Akhtar, Majid Niaz, Muhammad Saleem, and Muhammad Azhar Khan. "Al doped spinel and garnet nanostructured ferrites for microwave frequency C and X-band applications." Journal of Physics and Chemistry of Solids 123 (2018): 260-265.

Bagotia, Nisha, Veena Choudhary, and D. K. Sharma. "A review on the mechanical, electrical and EMI shielding properties of carbon nanotubes and graphene reinforced polycarbonate nanocomposites." Polymers for Advanced Technologies 29.6 (2018): 1547-1567.

Berardinelli, Gilberto, et al. "Beyond 5G wireless IRT for industry 4.0: Design principles and spectrum aspects." 2018 IEEE Globecom Workshops (GC Wkshps). IEEE, 2018.

Betzalel, Noa, Paul Ben Ishai, and Yuri Feldman. "The human skin as a sub-THz receiver—Does 5G pose a danger to it or not." Environmental research 163 (2018): 208-216.

Bier, Markus, Ludger Harnau, and S. Dietrich. "Free isotropic-nematic interfaces in fluids of charged platelike colloids." The Journal of chemical physics 123.11 (2005).

Brown, A. B. D., et al. "Phase separation and structure in a concentrated colloidal dispersion of uniform plates." The European Physical Journal B—Condensed Matter and Complex Systems 11 (1999): 481-489.

Che, R. Ch, et al. "Microwave absorption enhancement and complex permittivity and permeability of Fe encapsulated within carbon nanotubes." Advanced Materials 16.5 (2004): 401-405.

Chih-Lin, I., et al. "Toward green and soft: A 5G perspective." IEEE communications magazine 52.2 (2014): 66-73.

Chu, Xuan TA, et al. "Microwave absorption properties of iron nanoparticles prepared by ball-milling." Journal of Electronic Materials 45 (2016): 2311-2315.

Daab, Matthias, et al. "Onset of osmotic swelling in highly charged clay minerals." Langmuir 34.28 (2018): 8215-8222.

Di Ciaula, Agostino. "Towards 5G communication systems: Are there health implications." International journal of hygiene and environmental health 221.3 (2018): 367-375.

Feng, Xiao, et al. "High electromagnetic interference shielding effectiveness of carbon nanotube-cellulose composite films with layered structures." Macromolecular Materials and Engineering 303.11 (2018): 1800377.

Geetha, Shielding, et al. "EMI shielding: Methods and materials—A review." Journal of applied polymer science 112.4 (2009): 2073-2086.

Gundall, Michael, et al. "5G as enabler for industrie 4.0 use cases: Challenges and concepts." 2018 IEEE 23rd international conference on emerging technologies and factory automation (ETFA). vol. 1. IEEE, 2018.

Hirai, Junichi, and Isaya Yokota. "Electromagnetic shielding glass of frequency selective surfaces." 1999 International Symposium on Electromagnetic Compatibility (IEEE Cat. No. 99EX147). IEEE, 1999.

Imai, T., et al. "Development of high frequency band over 6 GHz for 5G mobile communication systems." 2015 9th European Conference on Antennas and Propagation (EuCAP). IEEE, 2015.

Jaroszewski, Maciej, Sabu Thomas, and Ajay V. Rane, eds. "Advanced materials for electromagnetic shielding: fundamentals, properties, and applications." (2018).

Jianzhong, Wang, et al. "Preparation and electromagnetic shielding effectiveness of metal fibers/polymer composite." Rare Metal Materials and Engineering 46.1 (2017): 73-77.

Kumar, Ashwini, et al. "Crystallographic and magnetic properties of nanocrystalline perovskite structure $SmFeO_3$ orthoferrite." Journal of Crystal Growth 490 (2018): 1-5.

Kumar, Sandeep, et al. "Complex permittivity, permeability, magnetic and microwave absorbing properties of $Ni^{2+}$ substituted mechanically milled U-type hexaferrites." Journal of Alloys and Compounds 774 (2019): 52-60.

Li, Da, et al. "A 2.5-D angularly stable frequency selective surface using via-based structure for 5G EMI shielding." IEEE Transactions on Electromagnetic Compatibility 60.3 (2017): 768-775.

Li, Da, et al. "A low-profile broadband bandpass frequency selective surface with two rapid band edges for 5G near-field applications." IEEE Transactions on Electromagnetic Compatibility 59.2 (2017): 670-676.

Liang, Jiyong, et al. "Electromagnetic shielding property of carbon fiber felt made of different types of short-chopped carbon fibers." Composites Part A: Applied Science and Manufacturing 121 (2019): 289-298.

Liu, Jia, et al. "Enhanced permittivity and multi-region microwave absorption of nanoneedle-like ZnO in the X-band at elevated temperature." Journal of Materials Chemistry C 3.18 (2015): 4670-4677.

Luo, Xiangcheng, and D. D. L. Chung. "Electromagnetic interference shielding using continuous carbon-fiber carbon-matrix and polymer-matrix composites." Composites Part B: Engineering 30.3 (1999): 227-231.

Meng, Fanbin, et al. "Graphene-based microwave absorbing composites: A review and prospective." Composites Part B: Engineering 137 (2018): 260-277.

Mologni, Juliano F., et al. "Investigation on the deployment of FSS as electromagnetic shielding for 5G devices." 2017 SBMO/IEEE MTT-S International Microwave and Optoelectronics Conference (IMOC). IEEE, 2017.

Osawa, Zenjiro, and Kazunaga Kobayashi. "Thermal stability of shielding effectiveness of electromagnetic interference of composites." Journal of materials science 22 (1987): 4381-4387.

(56) References Cited

OTHER PUBLICATIONS

Phan, C. H., M. Mariatti, and Y. H. Koh. "Electromagnetic interference shielding performance of epoxy composites filled with multiwalled carbon nanotubes/manganese zinc ferrite hybrid fillers." Journal of Magnetism and Magnetic Materials 401 (2016): 472-478.
Rao, Sriganesh K., and Ramjee Prasad. "Impact of 5G technologies on industry 4.0." Wireless personal communications 100 (2018): 145-159.
Roh, Jung-Sim, et al. "Electromagnetic shielding effectiveness of multifunctional metal composite fabrics." Textile Research Journal 78.9 (2008): 825-835.
Russell, Cindy L. "5 G wireless telecommunications expansion: Public health and environmental implications." Environmental research 165 (2018): 484-495.
Shukla, Vineeta. "Review of electromagnetic interference shielding materials fabricated by iron ingredients." Nanoscale Advances 1.5 (2019): 1640-1671.
Simko, Myrtill, and Mats-Olof Mattsson. "5G wireless communication and health effects—A pragmatic review based on available studies regarding 6 to 100 GHZ." International journal of environmental research and public health 16.18 (2019): 3406.
Standard, Military. High-Altitude Electromagnetic Pulse (HEMP) protection for ground-based C4I facilities performing critical, tine-urgent missions, Part 1 fixed facilities. vol. 1. MIL-STD-188-125, 2005.
Tikhomirov, Andrey, Elena Omelyanchuk, and Anastasia Semenova. "Recommended 5G frequency bands evaluation." 2018 Systems of Signals Generating and Processing in the Field of on Board Communications. IEEE, 2018.
Varghese, Anitha, and Deepaknath Tandur. "Wireless requirements and challenges in Industry 4.0." 2014 international conference on contemporary computing and informatics (IC3I). IEEE, 2014.
Korean Office Action and Translation dated Apr. 18, 2025 corresponding to KR10-2023-7000109, 14 pages.
Decision of Refusal dated Sep. 24, 2025 corresponding to JP2022-581411, 7 pages.

* cited by examiner

COMPOSITE MATERIAL AND SHIELDING AGAINST ELECTROMAGNETIC RADIATION

CROSS-REFERENCES TO RELATED APPLICATIONS

This application is a 371 National Phase Application of International Application PCT/EP2021/064328, filed on May 28, 2021, which claims priority to European Patent Application No. 20183790.3, filed Jul. 2, 2020 each of which is incorporated herein by reference, in their entirety.

The present invention relates to a composite material for shielding electromagnetic radiation and to a shielding against electromagnetic radiation.

Electric and electronic devices can be affected in their performance by interference with electromagnetic radiation, also referred to as electromagnetic waves. To secure a reliable and enduring operation of such electric and electronic devices it is important to protect these by shielding them from such electromagnetic radiation. Electric and electronic devices can be protected against stray radiation from outside by using a shielding. However, it is also possible to use a shielding to protect the environment from electromagnetic radiation generated by electric and electronic devices.

In addition, high frequency electromagnetic radiation is discussed because it's potential health hazard. This is particular the case for radiation in the higher GHz-range. The so-called millimeter wave range. GHz radiation is widely used for radar (3 MHz-110 GHz) and microwave ovens (2.455 GHz) and can cause thermal damage to biological material. For this reason, WHO, ICNIRP and IEEE have developed guidelines and regulations that limit the exposition of humans to values of 2-10 W $m^2$ in the range of 400 MHz to 300 GHz. This is also the range of frequencies increasingly used for new technical developments like radar based distance sensors (24 GHz and 77 GHz) and for the $5^{th}$ generation mobile communication, 5G (3-30 GHz and in later stage 30-300 GHz). Hence there is a broad and increasing demand for electromagnetic shielding materials in order to avoid malfunction of the devices and also to protect the health of humans and animals in a world, where the number of such devices is growing rapidly.

Moreover, without effective shielding, electromagnetic radiation is a source of interference, which impairs the function of electronic devices through the inductive and capacitive coupling of energy fields. Examples are crosstalk, noise, reflections and last but not least scrambling of digital signals. Network disturbances and also the complete failure of instruments, as they are found in critical areas such as medicine, transportation, security and data processing, are the result.

With the development of 5G technology, there is thus a need for improved and highly effective shielding. Highly effective electromagnetic interference (EMI) shielding materials are needed to reduce unwanted emissions, but also to protect the component itself from external stray signals. Of particular desire is the possibility of frequency selective surface structure for shielding (FSS), i.e. certain wavelengths are effectively shielded, whereas other wavelengths are not shielded.

One possibility for EMI shielding is to reflect radiation using electrically conductive materials. A further possibility of EMI shielding, which will become increasingly important in the future, uses the absorption of electromagnetic (EM) radiation when its electrical and/or magnetic dipoles interact with the radiation. A combination of both effects is based on the fact that scattering centers and interfaces or defect sites cause the EM radiation to get entrapped due to multiple internal reflection and scattering which lead to absorption and dissipation of the EM waves.

Simple metal sheaths that lead to reflections are widely used for low frequencies. In smaller devices and components, e.g. handheld devices, metal sheaths have disadvantages due to their weight, susceptibility to corrosion and higher processing costs of such metal sheaths compared to plastics. Consequently, even for EM shielding in the kilohertz range, light, inexpensive and easy-to-process shielding materials are required. Polymer composites with conductive fillers already fulfill these conditions for shielding in the kHz and MHz range. In the MHz range, they also offer special advantages due to their ability to absorb EM radiation. Metallic filler loads of often more than 35 wt. %, however, limit processability and corrosion resistance. Conductive carbon black as a filler is used for such composites, but also has disadvantages due to black abrasion. Other carbon forms such as carbon nanotubes and graphene are being investigated, also in combination with magnetic components, but show limitations in the GHz range and have not yet achieved a breakthrough in application.

The shielding efficiency of a material is defined for a certain wavelength as the attenuation of the electromagnetic radiation upon transmission through such material. Shielding is caused by reflection as well as by absorption. Heterogeneous materials like metal foams and metal composites with a dielectric material can be particular effective absorbers of electromagnetic radiation as they combine multiple reflection and absorption, thus increasing the path length of absorption. Absorption has its origin in generation of local currents (displacement current) that cause heating of the material, i.e., thermal dissipation of the electric energy.

Accordingly, there is a need for improved shielding materials especially for the broadband and radio frequency range of 3-300 GHz of 5G mobile radio technology.

This object is solved by the composite material for shielding electromagnetic radiation according to claim 1 and by a shielding against electromagnetic radiation comprising such a composite material. The composite material according to the present invention is a material for shielding electromagnetic radiation. It comprises a matrix material and metal fibers. The metal fibers are embedded in the matrix material. The metal fibers contain at least one, preferably one, of the elements selected from the group consisting of copper, silver, gold, nickel, palladium, platinum, cobalt, iron, chromium, vanadium, titanium, aluminum, silicon, lithium, combinations of the foregoing and alloys containing one or more of the foregoing.

The shielding according to the present invention can provide a strong absorption loss of up to 20 to 60 dB in the frequency range between 3 and 300 GHz. In addition, it is possible to apply the material even to miniature electronics as a coating, paint, lamination or adhesive tape. Moreover, in addition to being an effective shielding material, the composite according to the present invention is light weight, easy to process and impact resistant, since the low amount of metal fibers has only little influence on the properties of the matrix material, has a good corrosion resistance, since the metal fibers are embedded in the matrix material and relatively inexpensive, due to the low amount of metal fibers and allows for a great design freedom.

Without being bound by any theory, the mechanism of the GHz electromagnetic absorbing properties is not based on inherent conductivity loss but dielectric. According to Maxwell's equations, in a perfect conductor, when the charge carriers accelerates and decelerates in an electromagnetic field, a radiative field is produced which cancels out the incoming wave. In the composite according to the present invention, three mechanisms are combined to improve the shielding efficiency:

Absorption by antenna mechanism: Enhancement of absorption caused by adjusting the length of metal fibers to resonant-length antenna at GHz frequency range, i.e. quarter of a wavelength. The length of the metal fibers in the range of 1.0 mm to 25 mm turned out to be efficient in absorbing electromagnetic radiation in a frequency range in the range of 3 to 300 GHz, especially for the range of 3 to 30 GHz. Accordingly, the length of the metal fibers is preferably in the range of 1.0 to 25 mm, more preferably in the range of 1.3 to 20 mm, even more preferably in the range of 1.5 to 18 mm, even further more preferably in the range of 1.8 to 15 mm, highly preferably in the range of 1.9 to 10 mm. It is also possible to use metal fibers having a length of greater than 2.5 mm.

Impedance matching: The ideal conditions for impedance matching are achieved when $z_{in}=Z_0=377\Omega$. Here $Z_{in}$ is the impedance of the conductive disperse component and $Z_0$ is that of the dielectric matrix component. The above condition is met at a certain matching thickness ($t_m$) and matching frequency ($f_m$). Ideally, the effective frequency range should be as wide as possible, which can be controlled by tuning $t_m$ to a multiple of the ¼ wavelength ($n\lambda/4$). $n\lambda/4$ is the necessary length of dielectric material to achieve zero reflection due to destructive interference between incoming and reflected waves. An attenuation of −20 dB is considered to be 99% microwave absorption, which in most cases is considered sufficient shielding.

As a rule of thumb for Faraday cages, the ratio of the diameter of opening gaps to the wavelength of the electromagnetic waves to be shielded should be 1/10 or less. Thus, it is preferable when the average distance between the metal fibers is around $\lambda/10$ to prevent any transmission. This can be realized for the 3 to 300 GHz with the composite material of the present invention, when the content of metal fibers is preferably in the range of 0.02 to 2.5 wt. % based on the total weight of the composite material.

In the composite material according to the present invention, it is preferred that the matrix is an electrically insulating material. Thereby, the metal fibers are electrically isolated from one another. As a result, the shielding efficiency can be obtained on a high level. It is particularly preferred that the fibers are not in contact with each other, e.g. by providing the fibers at a concentration of less than 20 wt. % or adjusting the lengths of the fibers. A range of 0.02 to 2.5 wt. % is particularly preferred. With the fibers being not in contact with each other, it is possible to obtain the inventive composite material without significant DC conductivity. In this context it is particularly preferred that apart from the metal fibers no further conductive additives, such as carbon black or carbon nanotubes are included in the composite material of the invention.

It is preferable when the matrix is a polymeric material. This allows for isolating the metal fibers from one another and provides access to molding processes for polymeric materials, such as extrusion molding using e.g. a twin screw or a single screw extruder, injection molding, melt blowing, calendaring, lamination and so on. The polymeric material is preferably a thermoplastic material, a rubber material, or thermosetting resin material.

Preferred examples for thermoplastic materials are polyethylene, polypropylene, polystyrene and its copolymers, polymethacrylate and its copolymers, polyvinylchloride, polyamides, aliphatic polyesters, and aromatic polyesters, polyimide, polyacetal, polysiloxanes, polyphenylensulfide, polycarbonate, polyphenylenether, in particular PPO, polyetherketones, in particular PEK and PEEK, thermoplastic polyurethanes, thermoplastic derivates of cellulose.

Preferred examples for rubber materials include polybutadiene rubber, polyisoprene rubber, nitril-rubber (NBR), EPDM rubber, polysiloxane rubber, thermoplastic elastomers, such as thermoplastic olefins (TPO), copolymers of styrene, such as SBS and SEBS, thermoplastic urethanes (TPU), thermoplastic amide polymers and copolymers (TPA), thermoplastic polyester copolymers (TPC) and ionomers, e.g. copolymers of ethylene and methacrylic acid. Ionomers are available e.g. under the brand name Surlyn.

Preferred examples for suitable thermosetting resins and prepolymers which can be used as matrix materials are phenolic resins, such as Novolak and Bakelit, melamine resins, epoxide resins and polyurethanes.

The use of hydrophobic polymers is even more preferred, since they provide for an improved weather resistance of the embedded metal fibers. Preferred examples for such hydrophobic polymers are polyethylene, polypropylene, polystyrene and its copolymers, polyvinylchloride, polysiloxanes, polybutadiene rubber, polyisoprene rubber, nitril-rubber (NBR), EPDM rubber, polysiloxane rubber, thermoplastic elastomers, such as thermoplastic olefins (TPO), copolymers of styrene, such as SBS and SEBS, and phenolic resins.

The composite materials for electromagnetic shielding according to the present invention can be realized with a plurality of metal fibers. According to the present invention, the metal fibers contain at least one of the elements selected from the group consisting of copper, silver, gold, nickel, palladium, platinum, cobalt, iron, chromium, vanadium, titanium, aluminum, silicon, lithium, combinations of the foregoing and alloys containing one or more of the foregoing. Preferably, the metal fibers contain at least one or one of the elements selected from the group consisting of copper, silver, gold, nickel, palladium, platinum, iron, vanadium, aluminum, silicon, lithium, combinations of the foregoing and alloys containing one or more of the foregoing.

Particularly suitable metal fibers are such which are of at least one material selected from the group consisting of Cu and its alloys with Si, Fe and Mn, Al and its alloys with Si, Mg, Ti, Fe and Mn, μ-metals which are also known as permalloy and supermalloy, and Gold and Silver and their alloys. Also preferred are metal fibers of cobalt alloys, such as alloys consisting of cobalt and the balance iron, molybdenum, boron and/or silicon, for example $Co_{66}Fe_4Mo_2B_{12}Si_{16}$.

The metal fibers can be produced for example by melt spinning using an apparatus and a method for manufacturing metallic strands by melt spinning, such as described in the examples disclosed in European patent application with application number EP19175749.1, WO2016/020493 A1 and in WO2017/042155 A1, the contents of which are herewith incorporated by reference with respect to the method of forming and consequently obtaining the metal fibers. Accordingly, the metal fibers can be metal fibers of, e.g. Cu, $Cu_{99}Si_1$, $Cu_{96}Si_4$, Al, $Al_{99}Si_1$, $Fe_{40}Ni_{40}B_{20}$, Au, Ag, Pb, Si or combinations of the foregoing and alloys containing one or more of the foregoing. Surprisingly in all cases when copper as well as aluminum was alloyed with Si, Fe and Mn and compounded with a polymer matrix, in particular with a hydrophobic polymer, such as for example a polyolefine, a very good long-term corrosion stability was achieved. The same was observed for metal fibers of $Co_{66}Fe_4Mo_2B_{12}Si_{16}$. In contrast to other metal fibers that were obtained e.g. by bundle drawing, metal fibers obtained by melt spinning as described in European patent application with application number EP19175749.1, WO2016/020493 A1 and in WO2017/042155 A1 are less brittle, due to an amorphous or nanocrystalline structure. The lower brittleness makes it possible to process the metal fibers together with the matrix material by extrusion without breaking. More brittle fibers break during extrusion processing, so that they are shortened. It is therefore difficult to produce a composite material with metal fibers with a well-defined length, when the metal fibers are as brittle as those obtained from bundle drawing. As a consequence, metal fibers obtained by melt spinning, in particular those mentioned above, are preferably used in the composite material of the present invention. Such metal fibers can be provided in the desired length prior to extrusion processing, due to the flexibility of the metal fibers obtained from melt spinning, the length is maintained during extrusion processing so that the composite material of the present invention can be obtained with metal fibers of a well-defined length by using extrusion processing.

Excellent corrosion stability can be achieved, when amorphous metal fibers are used, in particular, when these are embedded in hydrophobic polymers. Therefore, it is in particular preferred when the metal fibers in the composite according to the present invention are amorphous metal fibers. It is even more preferred, when these amorphous metal fibers are embedded in a hydrophobic polymer material. In contrast to crystalline metal fibers, amorphous metal fibers have a vitreous structure or a nanocrystalline structure. A simple method for determining whether a metal fiber is amorphous is DSC measurement. An amorphous metal fiber shows an exothermic event during heating in a DSC measurement which cannot be observed in a crystalline metal fiber. The exothermic event can be caused e.g. by crystallization, i.e. transition from a vitreous structure to a crystalline structure. Typically, stainless steel fibers have a crystalline structure.

The absorption effect can be further improved if the metallic compound is magnetic with a soft magnetism because of magnetic induction. Therefore, it is highly preferable that the metal fibers are made of μ-metals, even more preferably μ-metals selected from the group consisting of μ-metals having a nickel content of 76 to 81 wt. % and the balance iron, copper, chromium and/or molybdenum. These μ-metals show a soft, more or less instantaneous magnetization and can absorb electromagnetic energy by magnetic induction. As a result, a particularly efficient shielding can be realized using metal fibers made of μ-metals. This is even the case, when the composite material comprising the μ-metals is produce using molding techniques, such as those mentioned above for polymeric materials.

Other highly preferred metal fibers are made of copper or copper-alloy, preferably $Cu_{99}Si_1$, $Cu_{98}Si_2$, $Cu_{98}Si_4$, $Cu_{88}Si_{12}$, or $Cu_{92}Sn_8$, or aluminum or aluminum-alloy, preferably $Al_{99}Si_1$. Copper-alloys and aluminum-alloys can be easier manufactured using melt-spinning technique in comparison to their pure metals, while they exhibit nearly the equal conductivity. Fibers of copper, copper-alloys, aluminum and aluminum-alloys show excellent shielding effects, due to the superior electrical conductivity making the generation of displacement currents easier.

It is preferred, that the metal fibers are not made of stainless steel. While it is in principle possible to use metal fibers made of stainless steel, better shielding results can be obtained with other metal fibers, such as those, mentioned above. Without being bound to a theory, it is noted that the shielding is dependent on the distance into the material at which the intensity of the electromagnetic wave is attenuated to 1/e, this distance is also knows as the skin depth δ. The skin depth is proportional to $\nu^{-1/2}$ and depends on the material, wherein ν is the frequency of the electromagnetic wave. In the frequency range of 1 to 100 GHz, the skin depths is 2.0 to 0.2 μm for copper, 2.6 to 0.2 μm for aluminum, 13.2 to 1.3 μm for steel and 59 μm to 5.9 μm for carbon. Due to the high skin depths for steel and carbon materials, it is preferred when the composite material of the present invention is essentially free of steel, in particular stainless steel, and carbon materials, such as carbon black, carbon fibers or carbon nanotubes. By using metal fibres of copper, copper-alloy, aluminum, aluminum alloy and/or μ-metals, the desired shielding effect can be realized with comparably thin fibers. By using thinner fibers, the surface to volume ratio is increased which further improves the shielding effectiveness.

The amount of the metal fibers in the composite according to the present invention is preferably set so, that the fibers are not in contact with each other, i.e. below the percolation threshold. To have the metal fibers below the percolation threshold, it is preferable that their concentration is less than 20 wt. %. Even more preferably the metal fiber concentration is in the range of 0.02 to 2.5 wt. %. In view of processability and shielding efficiency based on Faraday's law, the upper limit for the amount of metal fibers in the composite material is preferably less than 1 wt. %, more preferably less than 0.5 wt. % and even more preferably equal to or less than 0.25 wt. %, based on the total weight of the composite material. In view of shielding mechanisms based on absorption by antenna mechanism and impedance matching, the lower limit for the amount of metal fibers is preferably equal to or more than 0.04 wt. %, more preferably equal to or more than 0.05 wt. % and even more preferably equal to 0.06 wt. %, based on the total weight of the composite material. By adjusting the metal fiber concentration as described above, the distance between the fibers can be adjusted. By adjusting the distance between the fibers it is possible to selectively shield certain wavelengths of electromagnetic waves, whereas the shielding effect is less pronounced for other wavelengths.

The effects of the present invention can be particularly well obtained by using metal fibers having a surface to volume ratio of 0.5 to 4 $\mu m^{-1}$, preferably of 0.8 to 3.5 $\mu m^{-1}$, more preferably of 1.5 to 3.2 $\mu m^{-1}$, even more preferably of 2.0 to 3 $\mu m^{-1}$. Such fibers have a particularly large surface area relative to their weight which allows for an increase in induction of displacement currents resulting in a highly effective shielding of electromagnetic waves while at the same time weight and material can be saved.

In the composite material of the present invention, different shapes for the cross-section of the metal fibers may be used. Higher surface to volume ratios can be realized when the cross-section of the metal fibers is not circular. Thus, it is preferable that the cross-section has one edge that is less curved than the edge of another part of the cross-section, i.e. the radius of curvature of the less curved edge is larger than the radius of curvature at other portions of the cross-section. Preferred examples for a cross-section with one edge being less curved than another edge are an elliptical cross-section and a crescent-shaped cross-section and a semicircular cross-section. It is particularly preferred when the cross-section has one edge that is not curved, i.e. that is flat. More preferably, the metal fibers have a cross-section having two edges that are flat. Even more preferably, the cross-section of the metal fibers is rectangular.

In the present invention it is preferable to use metal fibers having a rectangular cross-section and metal fibers having an elliptical cross-section. In case of metal fibers having a rectangular cross-section, it is preferable that they have a width of 80 μm or less, more preferable of 70 μm or less, even more preferable of 40 μm or less and even further more preferably of 5 μm or less and preferably a thickness of 50 μm or less, more preferably of 30 μm or less, even more preferably of 10 μm or less and even further more preferably of 5 μm or less. There is no particular lower limit for the width and for the thickness of the metal fibers. However, the metal fibers may have a width of not less than 1 μm, preferably of not less than 3 μm and a thickness of not less than 1 μm.

In case of metal fibers having an elliptical cross-section it is preferable that they have an average diameter of 80 μm or less, more preferable of 70 μm or less, even more preferable of 40 μm or less and even further more preferably of 5 μm or less. The average diameter of the elliptical cross-section refers to an average of the largest diameter and the smallest diameter. There is no particular lower limit for the smallest diameter of the metal fibers with an elliptical cross-section. However, the smallest diameter may be not less than 1 μm, preferably not less than 3 μm and more preferably not less than 5 μm.

The cross-section of the metal fibers, regardless of the shape being rectangular, elliptical or crescent shaped or circular, is preferably equal to or less than 50 $\mu m^2$, more preferably equal to or less than 30 $\mu m^2$, even more preferably equal to or less than 25 $\mu m^2$, most preferably equal to or less than 20 $\mu m^2$. The lower limit for the cross-section of the metal fibers is preferably equal to or greater than 0.5 $\mu m^2$, more preferably equal to or greater than 1.0 $\mu m^2$. With a cross-section area, such as specified above, particularly fine-meshed networks of the metal fibers in the composite material are formed, resulting in a high shielding efficiency, as required for shielding in the GHz range. Without being bound to a theory, it is believed that the increase of the shielding efficiency is caused by the increased surface area when the cross-sectional area is as small as indicated above. The increased surface area results in an increase of induced displacement currents, as is explained in more detail below, resulting in a better shielding effect. At the same time, the weight for the composite material can be reduced, since the shielding can be achieved with a lower amount of metal fibers. In addition, these low cross-sectional areas in the range of 0.5 to 10 $\mu m^2$ allow improved processability, since the metal fibers are highly flexible, especially when metal fibers are used that are obtained by melt spinning.

It is preferable that in the composite according to the present invention, the metal fibers are not in electrical contact with each other. Thereby absorption by antenna mechanism can be optimized by adjusting the length of the fibers. Moreover, with the fibers being not in electrical contact with each other, DC conductivity of the composite material is reduced.

The composite material according to the present invention does not require additional conductive materials, such as carbon black, carbon fibers or carbon nanotubes. It is therefore preferable that the composite material according to the present invention does not contain carbon black, carbon fibers or carbon nanotubes. With the composite material being free of carbon black, carbon fibers and carbon nanotubes, staining due to abrasion can be avoided. In addition, it is possible to provide either transparent shieldings, in case it is desired to have a possibility to look through the shielding, or to color the shielding by adding pigments. It is to be understood that the term pigment as used herein does not encompass carbon black, carbon fibers and carbon nanotubes.

The composite of the present invention is preferably an electromagnetic shielding. Accordingly, also the use of the composite according to the present invention as electromagnetic shielding, particularly in the GHz range of 3 to 300 GHz, is part of the present invention. The use can be in the shielding of frequencies in the range of 3 to 30 GHz or in the range of 30 to 300 GHz or in both.

Preferably, the electromagnetic shielding comprising the composite material according to the present invention can have a single layer or can be produced from a multi-layer laminate, e.g. two or more layers. However, it is preferable that the electromagnetic shielding has a single layer for realizing the electromagnetic shielding. Such a single layer shielding can be easily produced and due to the composite material of the present invention combining three mechanisms for absorption of electromagnetic radiation is still highly effective in shielding such electromagnetic radiation.

A shielding against electromagnetic radiation which comprises the composite material as described above and in the claims is also part of the present invention.

Preferably, the shielding of the present invention is a housing for an electronic device or for a component thereof.

In this context, also an electronic device comprising at least one component which is shielded against electromagnetic radiation with a shielding as described above and in the claims, i.e. with the composite material as described above and in the claims, is part of the present invention.

Composites are prepared by cutting the fibers to an appropriate length corresponding to the EM spectrum that is to be shielded (see below). The metal fibers are either mixed with a fine powder of the matrix polymer before consolidation by melting or directly compounded with the polymer melt or monomeric resin mixture.

Direct compounding in a twin-screw extruder has been possible for the shorter fibers that are suitable for high frequency EM shielding without significant change in the average fiber length.

Figure 2:
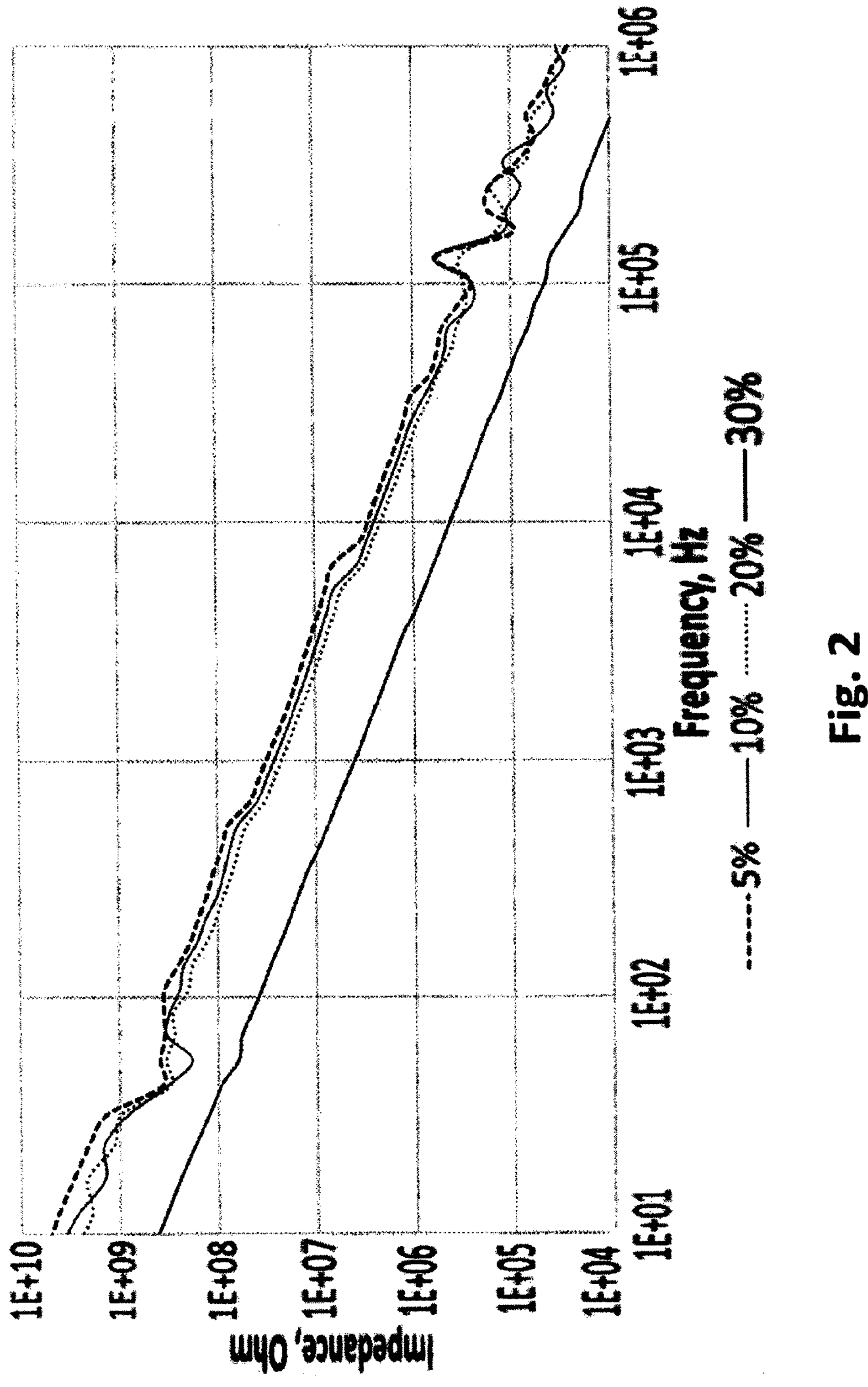

The invention will now be described in further detail and by way of example only with reference to the accompanying drawings and figures as well as by various examples of the composite material and the shielding of the invention. In the drawings there are shown:

FIG. 1 Schematic representation of the incident, reflected and transmitted power and electromagnetic field strengths when an EM wave strikes on a 3D Material FIG. 2 Impedance measured in the range of 1 Hz to 8 MHz for $CuSi_4$-TPS-SEBS composites of Example 3

Figure 3:
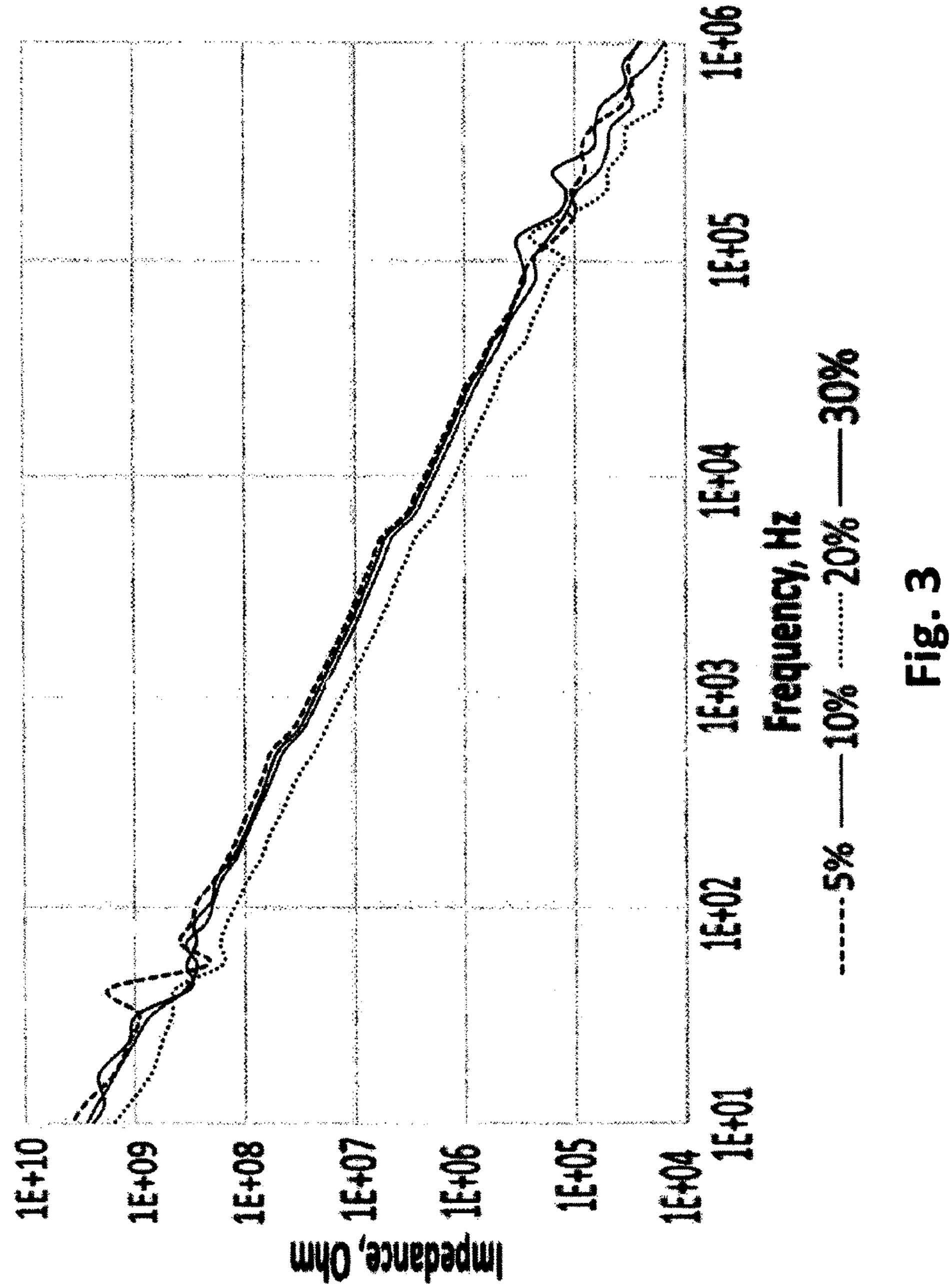

FIG. 3 Impedance measured in the range of 1 Hz to 8 MHz for $CuSi_4$-TPS-SEBS composites of Example 4

Figure 4:
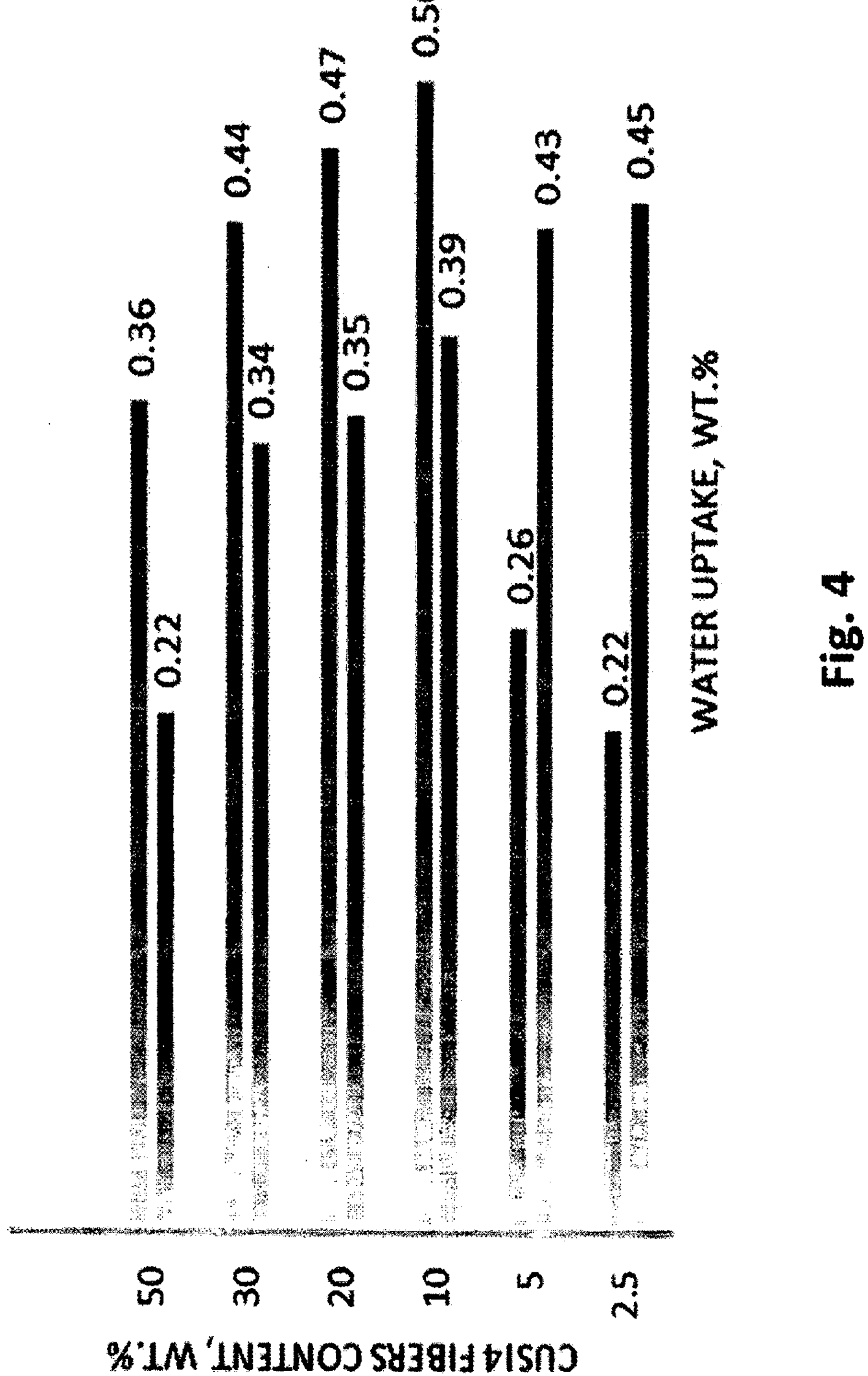

FIG. 4 Water uptake for composites of Examples 3 and 4

Figure 5:
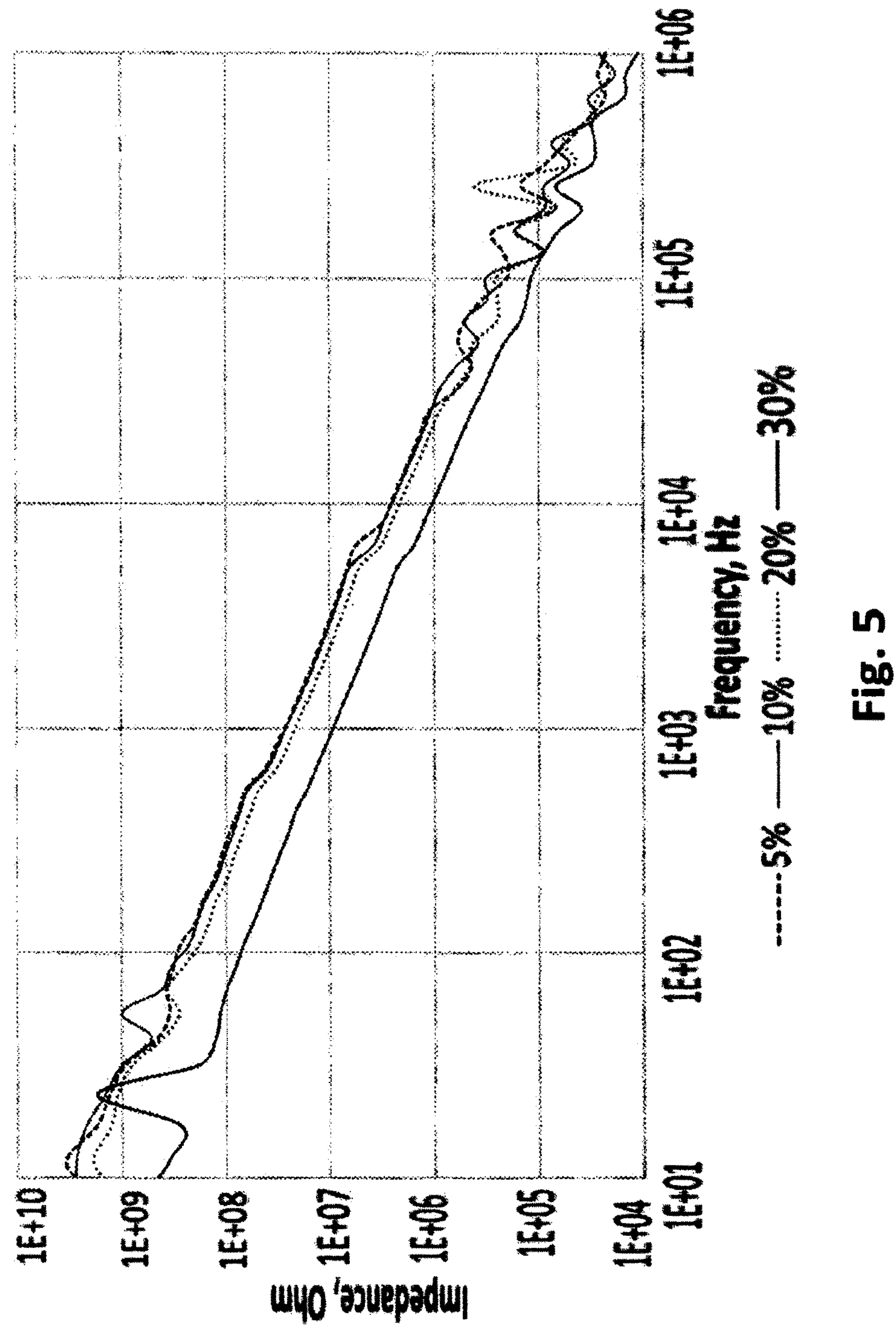
Figure 6:
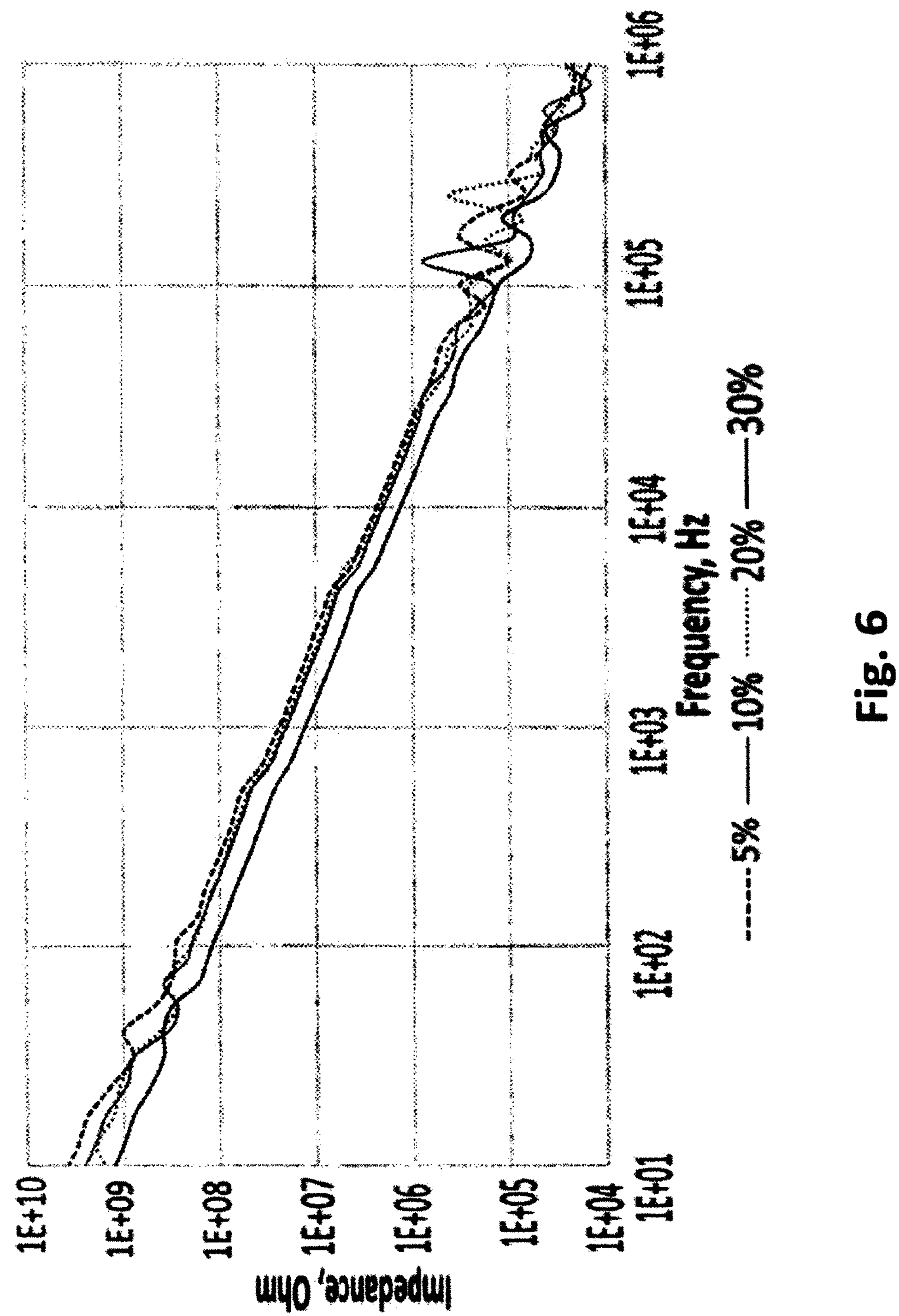
Figure 7:
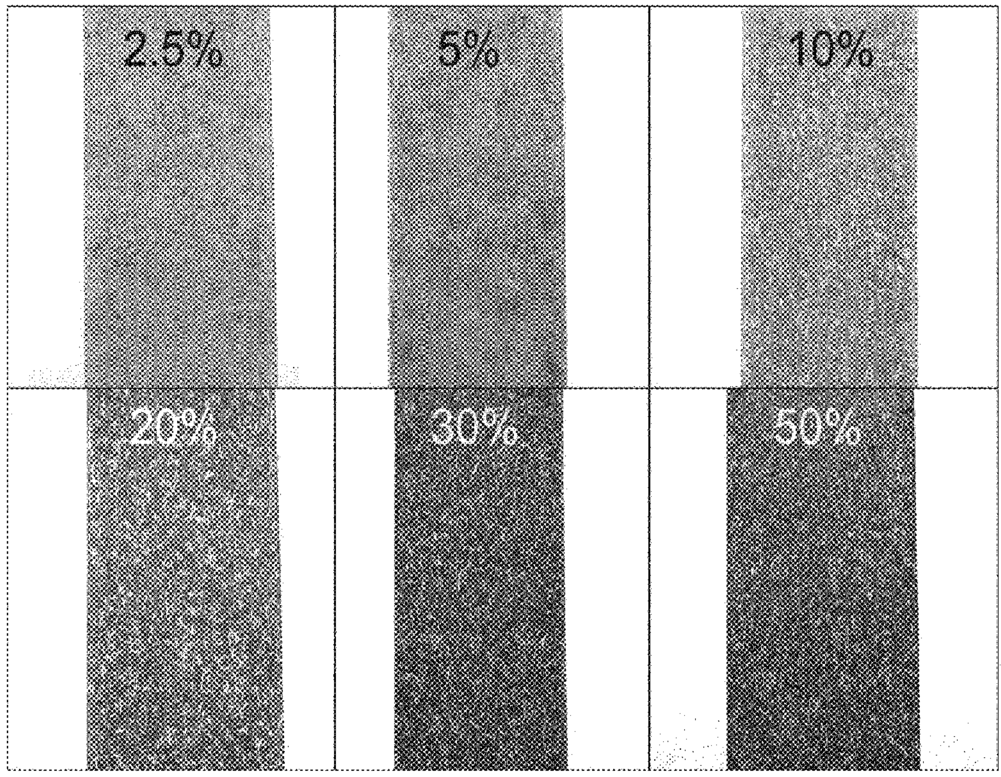

FIG. 5 Impedance measured in the range of 1 Hz to 8 MHz for $CuSi_4$-Nylon composites of Example 3 before and after aging in water FIG. 6 Impedance measured in the range of 1 Hz to 8 MHz for $CuSi_4$-Nylon composites of Example 4 before and after aging in water FIG. 7 Photographs of samples of Example 3 containing 0.5 wt. %, 2.5 wt. %, 10 wt. %, 20 wt. %, 30 wt. % and 50 wt. % of $CuSi_4$ fibers.

Shielding efficiency depends on reflection and absorption. Shielding efficiency (AE) measures how much a material attenuates the EM wave of a certain frequency as it passes through the material. FIG. 1 shows the possible interactions of EM waves with materials. When the EM waves reach the surface of a material, a certain portion of the incident power ($P_E$) is reflected ($P_R$), while another portion is absorbed and dissipated in the form of heat and the remaining portion is transmitted through the shielding material ($P_T$). Therefore, three different processes, namely reflection, absorption and multiple internal reflections contribute to the total attenuation, which corresponds to the shielding effectiveness (Eq. 1).

$$AE=10\log P_E/P_T=AE_{Reflection}+AE_{Absorption}+AE_{Multiple\text{-}Reflection} \quad (1)$$

The primary mechanism of EMI shielding is reflection. Reflection loss ($AE_{Reflection}$) is related to the relative impedance mismatch between the surface of the shielding material and the EM waves. The magnitude of the reflection loss is proportional to the ratio of conductivity (σ) to the magnetic permeability (μ) of the material, i.e. $AE_{Reflection} \propto \sigma/\mu$.

Due to their excellent electrical conductivity, metals can reflect or divert electromagnetic radiation very well as closed layers or networks. Electrical equipment in which high-frequency fields can build up static charges is generally protected by earthed metal shields. This prevents high-frequency electromagnetic radiation from escaping from the devices, while at the same time providing shielding against stray radiation from outside. However, simple metal shields in the GHz range are not very practical for small components and the need for electrically conductive seals that have to be compressed under high pressures.

A further mechanism of EMI shielding is absorption. The intensity of an EM wave decreases exponentially as it passes through the material of a conductor. The absorption loss causes the material to heat up due to the currents induced in the medium. The absorption loss ($AE_{Absorption}$) in decibels (dB) depends on the conductivity (σ), the magnetic permeability (μ) and the sample thickness (d), i.e. $AE_{Absorption} \propto \sigma\mu d$.

In thin films, absorption is favoured by multiple reflection between the two outer interfaces, the EM waves are reflected from the second interface, return to the first interface and are reflected from the first interface back to the second interface.

Wherein the depth of penetration δ is given by $\delta=(f\pi\sigma\mu)^{-1/2}$ and is defined as the thickness below the outer surface at which the incident field is attenuated to 1/e of its original value, wherein f is the frequency of the incident wave.

Also the shielding efficiency based on multiple reflections $AE_{Multiple\text{-}Reflection}$ is based on thickness d and depth of penetration δ can be expressed by equation (2)

$$AE_{Multiple-Reflection} = 20\log\left(1 - e^{-\frac{2d}{\delta}}\right) \quad (2)$$

Multiple reflection can also be achieved by an internal structure of the materials, e.g. in porous materials or composites whose components have a strongly varying permeability. In such heterogeneous microstructures a large variation of the local fields results. The different electromagnetic properties of the nano/micro-structures act as polarization spaces, which cause a delay of the displacement current compared to the conduction current. Under these conditions permittivity and permeability can be replaced by effective permittivity ($\varepsilon=\varepsilon'+i\varepsilon''$) and permeability ($\mu=\mu'+i\mu''$). ε' and μ' refer to electrical and magnetic energy storage, respectively. ε'' and μ'' denote the dielectric loss and the ohmic loss, respectively. These have a complex dependence on the geometry, size, conductivity and volume fraction of each component. A complete attenuation of the reflection of GHz waves from the surface of the composite (maximizing absorption) occurs when the impedance of the composite and free space are matched. The ideal conditions for impedance matching are when Zin=Z0=377Ω. Here, $Z_0$ is the intrinsic impedance of the free space and $Z_{in}$ is the input impedance of the absorber.

An attenuation of −20 dB is considered to be 99% microwave absorption, which in most cases is considered sufficient shielding. In addition, in technological areas not only efficient shielding is required, but also low weight, minimal thickness, corrosion and chemical resistance, good flexibility, tunable morphology, easy processing and economy.

The dependence of the AE on μ and σ (see Equation 2) shows that the shielding of conductive magnetic metals is dominated by absorption rather than reflection. This is due to the lower electrical conductivity, which results in lower reflection but greater penetration depth. Here, finely dispersed composite materials made of a thermoplastic and particularly thin fibres made of a soft magnetic metal, such as metals or alloys consisting of cobalt and the balance iron, molybdenum, boron and/or silicon, for example $Co_{66}Fe_4Mo_2B_{12}Si_{16}$ available under the brand name Vitrovac®, are ideal for shielding by absorption. As indicated above, fine fibers of such soft magnetic metal can be produced by melt spinning. Also the dimensions of the magnetic material has a great influence on the permeability. With larger particles, the losses of the displacement current increase due to the increase of the induced displacement voltage ($U_{displacement} \propto$ area) and lead to better AE results (shielding effect). In addition, the anisotropy of the metal fibres results in an increase in electromagnetic damping.

Next, the invention will be described under reference to non-limiting Examples.

Several exemplary composite materials were prepared. The compositions are summarized in table 1. For preparing the composite materials, the following compounding procedure was applied.

Compounding:

Compounding was made by using extrusion processing. A co-rotating twin-screw micro-compounder with conic screws and a volume of 15 mL (DSM Xplore, The Netherlands) was used for exemplary composites. The compositions are indicated in table 1. It is noted that the composite materials of Examples 1 and 2 were produced with concentrations of metal fibers being 0 wt. %, 10 wt. %, 20 wt. %, 30 wt. %, 40 wt. % and 50 wt. %. The composite materials of Examples 3 and 4 were produced with concentrations of metal fibers being 2.50 wt. %, 5 wt. %, 10 wt. %, 20 wt. %, 30 wt. % and 50 wt. %. Matrix material and metal fibers were fed simultaneously into the micro-compounder.

For Examples 1 and 2 the mixing was conducted at 210° C. with a screw rotation rate of 40 rpm for 10 min. The whole process was carried out under a nitrogen atmosphere. Afterwards, the resulting composites were processed on a 5.5 mL injection molding machine (DSM Xplore) into specimens with gauge length of 60 mm, width of 20 mm, and thickness of 2 mm under the following conditions: cylinder temperature 210° C., mold temperature 60° C., holding pressure 7 MPa, holding time 10 s, and cooling time 20 s.

For Example 3 the same procedure was used, however the temperature during mixing and of the cylinder during injection molding was 190° C. Photographic images of the composite materials of Example 3 are shown in FIG. 7 for different concentrations of metal fibers. It can be recognized from the photographs that with increasing concentration of metal fibers, the average distance between the metal fibers decreases. The percolation threshold of 30 to 20 wt. % observed for impedance measurements matches with the optical impression from the photographs.

The composite materials of Example 4 were identical to the composite materials of Example 3, however, they were processed by hot pressing instead of using injection molding as for Example 3. By hot pressing pellets having diameters of 25 mm and thicknesses of 1.6 mm were obtained by pressing under a pressure of 1.7 bar and a temperature 180° C. for 10 min (MetIPrep, Austria) from the composite materials of Example 4.

TABLE 1

| Example | Matrix material | Fiber Material | Length (mm) | Cross-section |
|---|---|---|---|---|
| 1 | ethylene-methacrylic acid ionomer | $CuSi_4$ | 2 | Rectangular, width, 10 μm, thickness 2 μm; area 20 $\mu m^2$ |
| 2 | Nylon-6 | $CuSi_4$ | 2 | Rectangular, width, 10 μm, thickness 2 μm; area 20 $\mu m^2$ |
| 3 | TPS-SEBS | $CuSi_4$ | 1.5 | Rectangular, width, 10 μm, thickness 2 μm; area 20 $\mu m^2$ |
| 4 | TPS-SEBS | $CuSi_4$ | 1.5 | Rectangular, width, 10 μm, thickness 2 μm; area 20 $\mu m^2$ |

SEBS is a hydrogenated thermoplastic styrene containing elastomer with excellent mechanical properties, chemical and heat resistance, that are produced by hydrogenation of styrene and butadiene block copolymers. SEBS-based compounds have excellent elastomeric properties and a rubber-like appearance and exhibit excellent weathering, UV and ozone resistance making them a preferred choice for outdoor and long service life applications. The chemical structure of SEBS is according to the following formula:

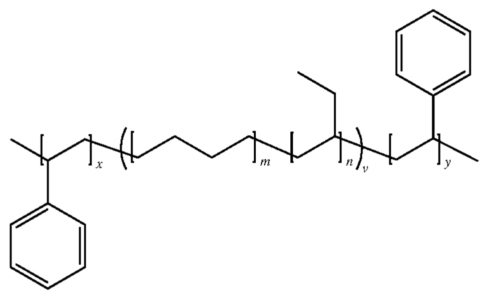

wherein x, m, n, v and y are integers.

Impedance measurements for composite materials of Example 3 are shown in FIG. 2 and of Example 4 are shown in FIG. 3. Impedance measurements for composite materials of Example 2 are comparable to those of Example 3. It can be recognized that the that the percolation threshold for the composite materials of Example 3 that were obtained by injection molding is between 30 and 20 wt. %, the same holds true for the composite materials of Example 2. A similar percolation threshold was observed for the composite materials of Example 4, however, the percolation limit appears to be less abrupt which can be explained by lesser homogeneity of the samples prepared by hot pressing compared to those obtained by injection molding.

Preparation of Coatings

Solvent borne coating was prepared using a KPG stirrer according to the following procedure. Laropal A 81 (60% solids in PMS) (20 g) and 5 g GARAMITE-7305 in 62 mL of 1-methoxy-2-propyl acetate were stirred for 5 min at 1000 rpm. Then, 18 g of $CuSi_4$ fibers (length around 1.5 mm) was added and stirred for another 5 min at 500 rpm. The dispersion was applied as a coating to polycarbonate plates using a drawdown rod (doctor blade) and then cured at room temperature for 24 h.

Corrosion Tests

To evaluate a corrosion resistance of the composites obtained, the samples were aged in distilled water for 7 days under the temperature 50° C. After the treatment no pitting, general attack of corrosion or $CuSi_4$ fibers oxidation were observed. Samples were weighted before and after aging in water and the total water uptake was evaluated and amounted from 0.22 to 0.5 wt. %, which indicates a high resistance of the polymer composite to hydration. Water uptake for composite materials of Examples 3 and 4 are shown in FIG. 4, wherein the upper bars refer to the composite materials of Example 4 and the lower bars refer to the composite materials of Example 3. It is noted that a complete oxidation of copper to CuO would be accompanied by a weight increase of 25%. In particular for those samples having a high copper content, the oxidation of copper is limited to less than 2 to 3% of the metal. This indicates a high corrosion resistance. The comparably higher relative amount of oxidation for samples with low fiber content can be explained by surface effects that can be avoided by altering the compounding conditions.

Impedance did not significantly change after corrosion tests, as can be recognized from FIG. 5 for the composite materials of Example 3 and from FIG. 6 for the composite materials of Example 4. This confirms the high corrosion stability of the obtained composite materials.

Shielding

An EMI shielding composition was prepared from the composition of Example 2, comprising $CuSi_4$ bands (2 μm thickness, 10 μm width and 2 mm length) and Nylon-6 as matrix material. The composite was chopped into pellets, and the pellets were molded into an injection molding machine. Impedance at 1 Hz-8 MHz range with 20 mV amplitude (except low-impedance samples without dielectric barrier, for which 5 mV was applied) were measured using Electrochemical Workstation IM6 (ZAHNER-elektrik GmbH & Co. KG). A measurement cell with stainless steel disk electrodes D=18 mm was used for 2-electrodes impedance measurement across the thickness of pellets. A 25 μm-thick Kapton film was placed as a dielectric barrier (DB) at one of the electrodes. This permits to eliminate situations, when a single highly-conductive path in the material short-circuits the electrodes. The cell was connected to IM6 with short cables from IM6 set; IM6 was configured for 4-electrodes measurements to compensate impedance of the cables. The results are shown in FIG. 2.

Based on this result the reflection loss (RL) is obtained by $$RL(\text{dB}) = 20\log\left(\frac{Z_{sample} - Z_{air}}{Z_{sample} + Z_{air}}\right)$$

This results in an attenuation between −3–−6 dB, i.e. 10-30% absorption of electromagnetic energy. At higher frequencies, the power loss of the charge displacement is increased. At 8 GHz, the observed power loss of electromagnetic wave was increased by $10^6$ ($P \propto f^2$), so that practically complete shielding is achieved in the GHz range.

The invention claimed is:

1. A composite material for shielding electromagnetic radiation in the GHz range, comprising a matrix material and metal fibers, wherein the metal fibers contain at least one of the elements selected from the group consisting of copper, silver, gold, nickel, palladium, platinum, cobalt, iron, chromium, vanadium, titanium, aluminum, silicon, lithium, combinations of the foregoing and alloys containing one or more of the foregoing, wherein the metal fibers have a surface to volume ratio of 0.5 to 4 $\mu m^{-1}$, wherein the metal fibers provide absorption loss of 20 to 60 dB over a frequency band range of 3 to 300 GHz, wherein the metal fibers are not in electrical contact with each other, wherein the amount of the metal fibers in the composite is set such that it is below the percolation threshold, ensuring that the fibers are not in contact with each other, and wherein the average distance between adjacent fibers is $\lambda/10$ or less, where $\lambda$ is the wavelength of the electromagnetic radiation to be shielded.

2. Composite material according to claim 1, wherein the metal fibers are of at least one material selected from the group consisting of Cu and its alloys with Si, Fe and Mn, Al and its alloys with Si, Mg, Ti, Fe and Mn, μ-metals, and Gold and Silver and their alloys.

3. Composite material according to claim 1, wherein the metal fibers are copper metal fibers or copper-alloy fibers or aluminum metal fibers or aluminum-alloy fibers.

4. Composite material according to claim 1, wherein the metal fibers are not made of stainless steel.

5. Composite material according to claim 1, wherein the metal fibers have a cross-section which is not circular.

6. Composite material according to claim 1, wherein the metal fibers have a cross-section having one edge that is less curved than the edge of another part of the cross-section.

7. Composite material according to claim 1, wherein the metal fibers have a cross-section that has one edge that is not curved.

8. Composite material according to claim 1, wherein the amount of metal fibers in the composite material is in the range of 0.02 to 2.5 wt. % based on the total weight of the composite material.

9. Composite material according to claim 1, wherein the matrix is an electrically insulating material.

10. Composite material according to claim 1, wherein the composite material is an electromagnetic shielding.

11. Composite material according to claim 1, wherein the electromagnetic shielding has one layer.

12. Composite material according to claim 3, wherein the metal fibers are one of $Cu_{99}Si_1$, $Cu_{98}Si_2$, $Cu_{96}Si_4$, $Cu_{88}Si_{12}$, $Cu_{92}Sn_8$, and $Al_{99}Si_1$.

13. Composite material according to claim 4, wherein the metal fibers are not made of steel.

14. Composite according to claim 6, wherein the cross-section is an elliptically shaped cross-section or a crescent-shaped cross-section.

15. Composite according to claim 7, wherein the cross-section of the metal fibers is rectangular.

16. Composite according to claim 9, wherein the matrix is a polymeric material.

* * * * *